(12) United States Patent
Zhou et al.

(10) Patent No.: US 9,455,351 B1
(45) Date of Patent: Sep. 27, 2016

(54) OXIDE SEMICONDUCTOR FIELD EFFECT TRANSISTOR DEVICE AND METHOD FOR MANUFACTURING THE SAME

(71) Applicant: UNITED MICROELECTRONICS CORP., Hsin-Chu (TW)

(72) Inventors: Zhibiao Zhou, Singapore (SG); Shao-Hui Wu, Singapore (SG); Chi-Fa Ku, Kaohsiung (TW); Chen-Bin Lin, Taipei (TW); Chun-Yuan Wu, Yun-Lin County (TW)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 0 days.

(21) Appl. No.: 14/841,731

(22) Filed: Sep. 1, 2015

(51) Int. Cl.
H01L 29/786 (2006.01)
H01L 29/66 (2006.01)
H01L 27/12 (2006.01)
H01L 29/417 (2006.01)

(52) U.S. Cl.
CPC ....... *H01L 29/7869* (2013.01); *H01L 27/1225* (2013.01); *H01L 27/1259* (2013.01); *H01L 29/41733* (2013.01); *H01L 29/66969* (2013.01)

(58) Field of Classification Search
CPC ... H01L 29/7869; H01L 21/16; H01L 21/00; H01L 29/24; H01L 21/479; H01L 21/02554; H01L 21/02565; H01L 45/145
USPC .............................................. 257/43; 438/104
See application file for complete search history.

(56) References Cited

U.S. PATENT DOCUMENTS

| | | | |
|---|---|---|---|
| 8,618,537 B2 | 12/2013 | Kaneko et al. | |
| 8,796,681 B2 | 8/2014 | Yamade et al. | |
| 2013/0181214 A1* | 7/2013 | Yamazaki | H01L 29/7869 257/43 |
| 2013/0256666 A1 | 10/2013 | Chang et al. | |
| 2015/0021596 A1* | 1/2015 | Yamazaki | H01L 29/78693 257/43 |

* cited by examiner

*Primary Examiner* — Walter H Swanson
(74) *Attorney, Agent, or Firm* — Winston Hsu; Scott Margo

(57) ABSTRACT

An oxide semiconductor field effect transistor (OS FET) device includes a first dielectric layer formed on a substrate, an oxide semiconductor (OS) island formed on the first dielectric layer, a first gate electrode formed on the OS island, a gate dielectric layer formed in between the first gate electrode and the OS island, a patterned hard mask layer formed on a top surface of the first gate electrode, an etch stop layer covering a top surface of the patterned hard mask layer and sidewalls of the first gate electrode, and a source electrode and a drain electrode formed on the OS island. At least one of the source electrode and the drain electrode partially overlaps the etching stop layer on the sidewalls of the first gate electrode.

20 Claims, 4 Drawing Sheets

OXIDE SEMICONDUCTOR FIELD EFFECT TRANSISTOR DEVICE AND METHOD FOR MANUFACTURING THE SAME

BACKGROUND OF THE INVENTION

1. Field of the Invention

The present invention relates to an oxide semiconductor field effect transistor (hereinafter abbreviated as OS FET) device and a method for manufacturing the same, and more particularly, to an OS FET device and a method for manufacturing the same with a simplified process flow.

2. Description of the Prior Art

To obtain an extremely low off-state current, a channel of the field effect transistor (FET) may be formed using oxide semiconductor (OS) material(s) that has a band gap (greater than or equal to 3.0 eV) wider than Si or Ge. Accordingly, a field effect transistor including a channel layer formed using the oxide semiconductor material(s) is referred to as an OS FET device.

OS FET device has been integrated in thin film transistor liquid crystal displays (TFT-LCD), and now is used in semiconductor industry. However, the channel layer of the OS FET device is sensitive to water, oxygen, acid etchant, or the like. Therefore, any changes in ambient environment in the manufacturing process would alter the characteristics of the OS FET device. Accordingly, there are incessant needs to improve the stability of the OS channel layer and to protect the OS channel layer from environment impacts during manufacturing the OS FET device.

SUMMARY OF THE INVENTION

According to an aspect of the present invention, an OS FET device is provided. The OS FET device includes a first dielectric layer formed on a substrate, an OS island formed on the first dielectric layer, a first gate electrode formed on the OS island, a gate dielectric layer formed in between the first gate electrode and the OS island, a patterned hard mask layer formed on a top surface of the first gate electrode, an etch stop layer covering a top surface of the patterned hard mask layer and sidewalls of the first gate electrode, and a source electrode and a drain electrode formed on the OS island. Furthermore, at least one of the source electrode and the drain electrode partially overlaps the etching stop layer on the sidewalls of the first gate electrode.

According to another aspect of the present invention, a method for manufacturing an OS FET device is provided. The method for manufacturing the OS FET device includes following steps. A first dielectric layer is provided on a substrate and followed by forming an OS island on the first dielectric layer. A gate dielectric layer is subsequently formed on the OS island and followed by forming a first gate electrode on the gate dielectric layer. A top surface of the first gate electrode is covered by a patterned hard mask layer. Next, an etch stop layer is formed on the first dielectric layer, the OS island and the first gate electrode. A top surface and sidewalls of the first gate electrode are covered by the etch stop layer. Then, a source electrode and a drain electrode are formed on the OS island. The source electrode and the drain electrode respectively contact the OS island. At least one of the source electrode and the drain electrode partially overlap the etch stop layer on the sidewalls of the first gate electrode.

According to the OS FET device and the method for manufacturing the same provided by the present invention, the gate electrode is formed on the OS island to define and cover the channel region. Therefore, the sensitive OS channel region is protected from any impact that might be generated in the subsequent steps. Furthermore, the etch stop layer is provided to protect the gate electrode and thus self-align source/drain process is performed without damaging the profile of the gate electrode. Accordingly, the present invention provides a simplified process for the method for manufacturing the OS FET device and the reliability and stability of the OS FET device are both improved.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-7 are schematic drawings illustrating a method for manufacturing an OS FET device provided by a preferred embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, FIG. 5 is a top view of the FIG. 4, FIG. 6 is a schematic drawing in a step subsequent to FIG. 4, and FIG. 7 is a top view of FIG. 6.

DETAILED DESCRIPTION

Figure 1:
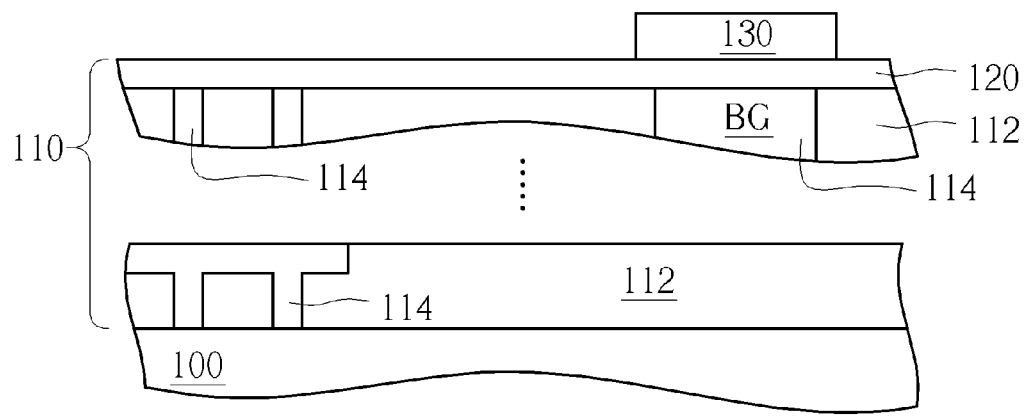

Please refer to FIGS. 1-7, which are schematic drawings illustrating a method for manufacturing an OS FET device provided by a preferred embodiment of the present invention. As shown in FIG. 1, a substrate 100 is provided, and integrated circuit(s) including a plurality of active and passive devices (not shown) can be fabricated in and/or on the substrate 100 by front-end-of-line (hereinafter abbreviated as FEOL) process. The substrate 100 is typically a chip or die including a piece of a semiconductor wafer composed of a semiconductor material including, for example but not limited to, silicon (Si), silicon germanium (SiGe), a silicon-on-insulator (SOI) layer, and other like silicon-containing semiconductor materials. Device designs for the above mentioned active/passive devices and the details of the FEOL process are familiar to a person having ordinary skill in the art, therefore those details are all omitted in the interest of brevity.

Next, a back-end-of-line (hereinafter abbreviated as BEOL) interconnection structure 110 is formed on the substrate 100. The BEOL interconnection structure 110 interconnects the active/passive devices of the integrated circuit(s) and may provide circuit-to-circuit connections, or may establish contacts with input and output terminals. As shown in FIG. 1, the BEOL interconnection structure 110 includes a plurality of dielectric layers 112 such as interlayer dielectric layers or inter-metal dielectric (IMD) layers and a plurality of metal layers 114 (including wires and vias) formed in the dielectric layers 112. The dielectric layers 112 include, for example but not limited to, silicon oxide (SiO) and the metal layers 114 include, also for example but not limited to, aluminum (Al) or copper (Cu). It is well-known to those skilled in the art that the BEOL interconnection structure 110 is formed by steps of forming one dielectric layer 112, forming recesses (not shown) in the dielectric layer 112, and filling up the recesses with metal material such as Al or Cu to form the metal layers 114. These abovementioned steps can be repeated any number of times to form the stacked structure of the BEOL interconnection structure 110. As shown in FIG. 1, a metal layer 114 can be designated to be a back gate BG for an OS FET device if required. Next, a dielectric layer 120 is blanketly formed on the substrate 100. The dielectric layer 120 can include hafnium aluminum oxide (HfAlO), aluminum oxide (AlO), hafnium oxide (HfO), silicon nitride (SiN), zirconium oxide (ZrO) or a combination thereof, but not limited to this. Or, the dielectric layer 120 can include an inter-metal dielectric layer if required.

Please still refer to FIG. 1. Next, an OS layer (not shown), which includes a single layer or a multiple layer, is formed on the dielectric layer 120 and followed by a patterning process. Consequently, an OS island 130 is formed on the dielectric layer 120. The OS island 130 includes, for example but not limited to, indium oxide, tin oxide, zinc oxide, two-component metal oxide such as In—Zn-based oxide, Sn—Zn-based oxide, Al—Zn-based oxide, Zn—Mg-based oxide, Sn—Mg-based oxide, In—Mg-based oxide, or In—Ga-based oxide, three-component metal oxide such as In—Ga—Zn-based oxide (also referred to as IGZO), In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—La—Zn-based oxide, In—Ce—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, or In—Lu—Zn-based oxide, four-component metal oxide such as In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, or In—Hf—Al—Zn-based oxide. Furthermore, the OS island 130 can include a c-axis aligned crystalline oxide semiconductor (CAAC-OS) material.

Figure 2:
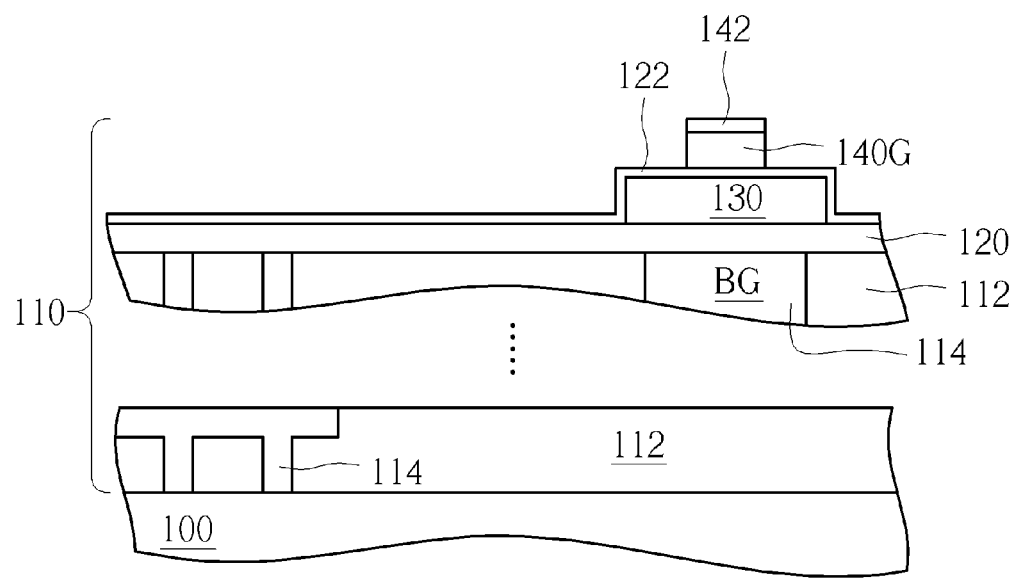

Please refer to FIG. 2. After forming the OS island 130, a gate dielectric layer 122 is formed on OS island 130 and the dielectric layer 120, and followed by forming a metal layer. A patterned hard mask 142 is then formed on the metal layer, and an etching process is performed with the patterned hard mask 142 serving as an etching mask such that a gate electrode 140G is formed on the OS island 130 and the gate dielectric layer 122. The patterned hard mask 142 can include SiO, SiN, silicon oxynitride (SiON), or a combination thereof, but not limited to this. Particularly, the gate dielectric layer 122 is formed in between the gate electrode 140G and the OS island 130 to provide isolation. As shown in FIG. 2, during etching the metal layer to form the gate electrode 140G, the gate dielectric layer 122 that covers sidewalls of the OS island 130 and portions of atop surface of the OS island 130 protects the OS island 130. The gate dielectric layer 122 can include HfAlO, AlO, HfO, SiN, ZrO or a combination thereof, but not limited to this. More important, the gate electrode 140G, which defines and covers an OS channel region, protects the underneath OS channel region during the etching process. The gate electrode 140G even protects the OS channel region in subsequent steps. Therefore the OS channel region, which is sensitive to water, oxygen, etchant or the like, is completely protected from any impact that might be generated in the manufacturing steps.

Figure 3:
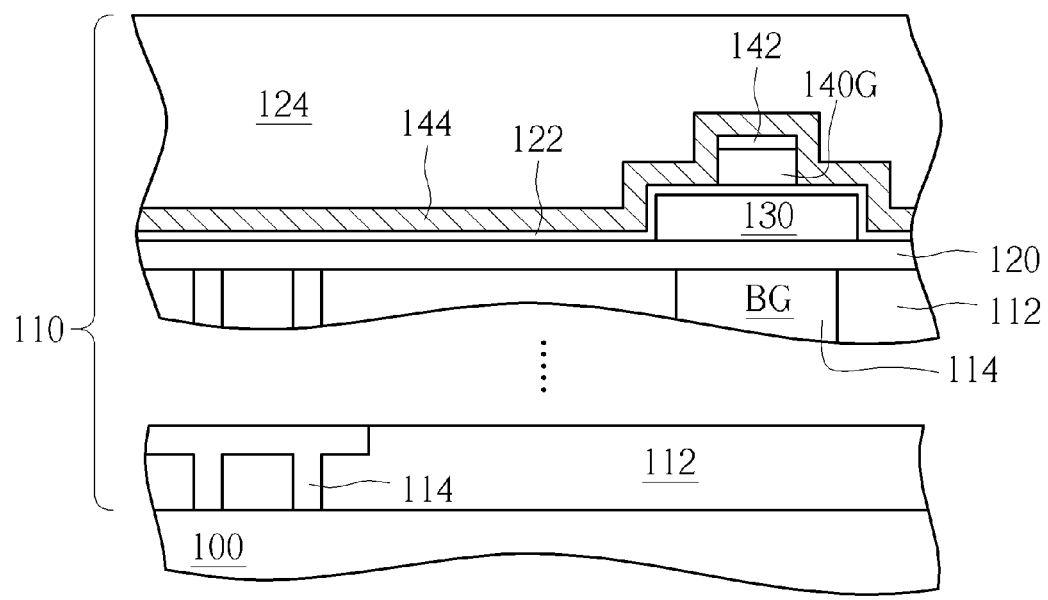

Please refer to FIG. 3. After forming the gate electrode 140G with the patterned hard mask 142 formed thereon, an etch stop layer 144 is formed on the dielectric layer 120, the OS island 130 and the gate electrode 140G. As shown in FIG. 3, a top surface and sidewalls of the gate electrode 140G are covered by the etch stop layer 144. Particularly speaking, the etch stop layer 144 covers a top surface of the patterned hard mask 142 on the gate electrode 140G, and covers the sidewalls of patterned hard mask 142 and the sidewalls of the gate electrode 140G. Furthermore, the etch stop layer 144 also covers the sidewalls of the OS island 130 and portions of the top surface of the OS island 130, as shown in FIG. 3. The etch stop layer 144 includes AlO, HfO, HfAlO, SiN, ZrO or a combination thereof, but not limited to this. A thickness of the etch stop layer 144 is larger than 5 nanometer (nm), preferably between 5 nm and 10 nm in accordance with the preferred embodiment, but not limited to this. Please still refer to FIG. 3. After forming the etch stop layer 144, a dielectric layer 124 such as an inter-metal dielectric layer is formed on the etch stop layer 144.

Figure 4:
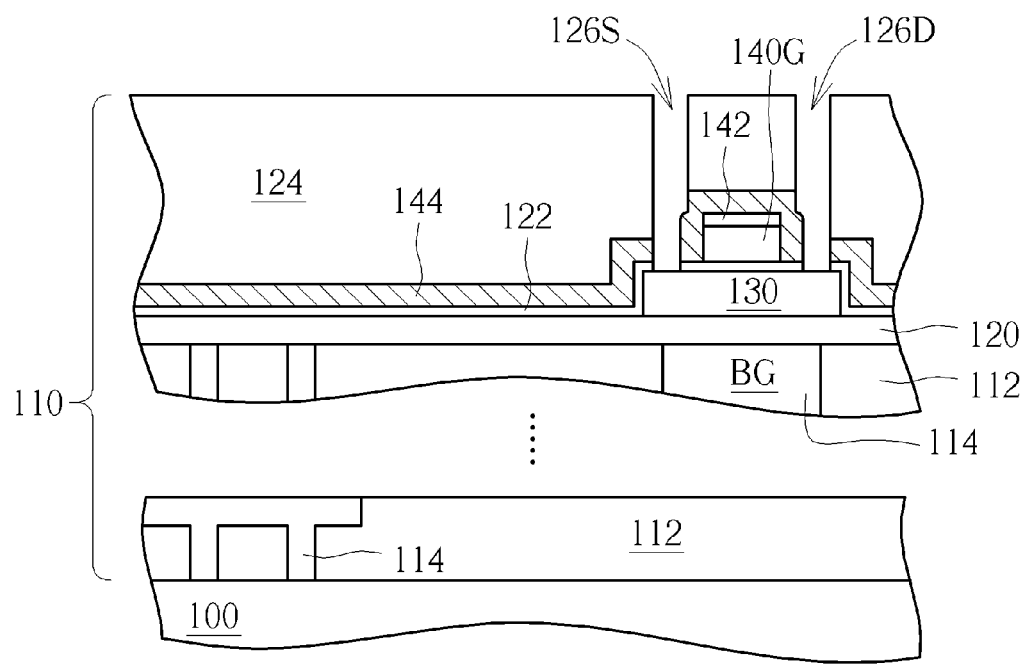

Please refer to FIG. 4. After forming the dielectric layer 124, another etching process is performed to remove a portion of the dielectric layer 124, a portion of the etch stop layer 144, and a portion of the gate dielectric layer 122, and thus a source opening 126S and a drain opening 126D are formed in the dielectric layer 124, the etch stop layer 144 and the gate dielectric layer 122. It is noteworthy that because the etch stop layer 144 covers the sidewalls of the gate electrode 140G, the source openings 126S and the drain opening 126D can be formed by self-aligned technique without impacting and damaging the profile of the gate electrode 140G. As shown in FIG. 4, the OS island 130 is exposed at bottoms of the source opening 126S and the drain opening 126D. Additionally, the etch stop layer 144 is exposed at sidewalls of the source opening 126S and the drain opening 126D as shown in FIG. 4.

Figure 5:
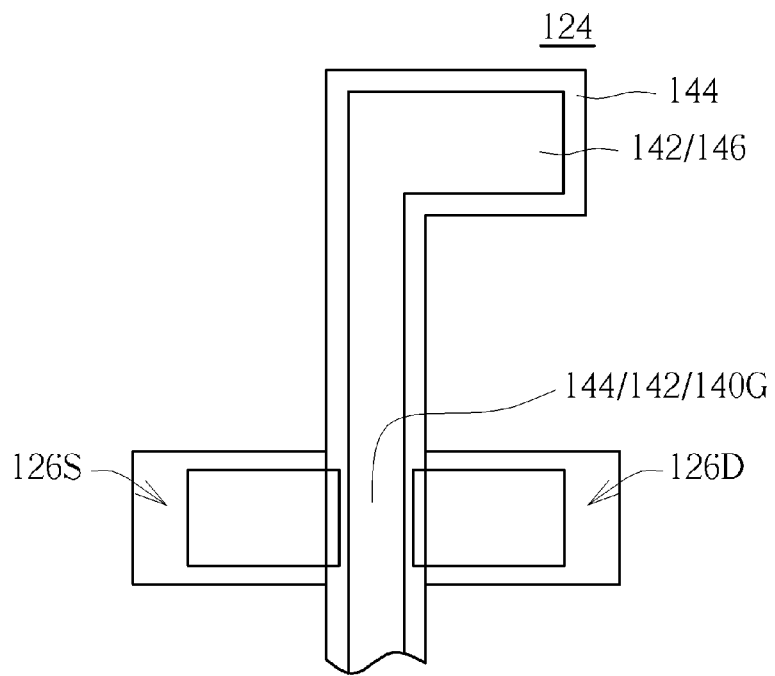

Please refer to FIG. 5, which is a top view of FIG. 4. It is noteworthy that the preferred embodiment further provides a gate contacting region 146 physically and electrically contacting the gate electrode 140G. In fact, the gate contacting region 146 and the gate electrode 140G are defined by the patterned hard mask 142. More important, the gate contacting region 146 and the gate electrode 140G are simultaneously formed by the etching process for forming the gate electrode 140G. Therefore, the patterned hard mask layer 142 also covers a top surface of the gate contacting region 146. And the subsequently formed etch stop layer 144 covers the top surface and sidewalls of the gate contacting region 146 as shown in FIG. 5. According to the preferred embodiment, the etch stop layer 144 and the patterned hard mask layer 142 are removed from the top surface of the gate contacting region 146 before or after forming the source openings 126S and the drain opening 126D. In other words, the etch stop layer 144 and the gate dielectric layer 122 are removed to expose the OS island 130 in the source openings 126S and the drain opening 126D while the etch stop layer 144 and the patterned hard mask 142 are kept on the gate contacting region 146 as shown in FIG. 5.

Figure 6:
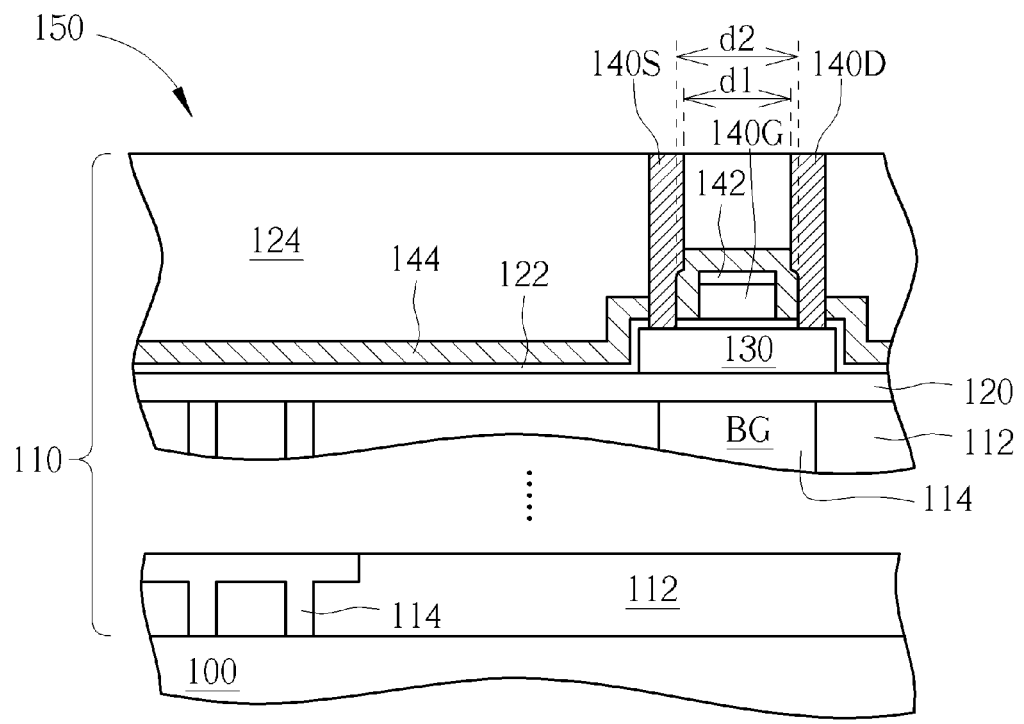

Please refer to FIG. 6. Next, a metal layer is formed, and the source openings 126S and the drain opening 126D are filled up with the metal layer. A planarization process is then performed to remove superfluous metal layers and thus a source electrode 140S is formed in the source opening 126S and a drain electrode 140D is formed in the drain opening 126D, respectively. As shown in FIG. 6, the source electrode 140S and the drain electrode 140D are formed on the OS island 130. More important, the source electrode 140S and the drain electrode 140D contact the OS island 130, respectively. Consequently, an OS FET device 150 is obtained. Additionally, the OS transistor device 150 is formed by the BEOL process, and is referred to as a part of the BEOL interconnection structure 110. And a plurality of vias (not shown) can be formed simultaneously with forming the source electrode 140S and the drain electrode 140D. It should be noted that at least one of the source electrode 140S and the drain electrode 140D partially overlaps the etching stop layer 144 on the sidewalls of the gate electrode 140. The source electrode 140S and the drain electrode 140D, however, can be both partially overlap the etching stop layer 144 on the sidewalls of the gate electrode 140 as shown in FIG. 6. It should be noted that since the sidewalls of the gate electrode 140G are covered by the etch stop layer 144, no contact between the gate electrode 140G and the source electrode 140S and between the gate electrode 140G and the drain electrode 140D will occur. In other words, the short circuit issue between the gate electrode 140G and the source/drain electrodes 140S/140D is completely avoided.

Figure 7:
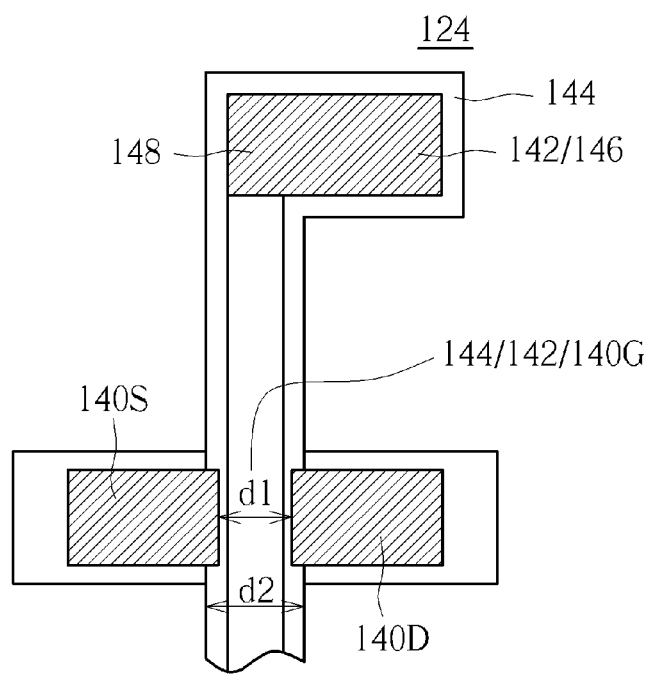

Please refer to FIG. 7, which is a top view of FIG. 6. As mentioned above, the etch stop layer 144 and the patterned hard mask layer 142 are removed from the top surface of the gate contacting region 146 before or after forming the source openings 126S and the drain opening 126D. According to the preferred embodiment, a gate contacting opening (not shown) is therefore formed to expose the gate contacting region 146. Subsequently, the gate contacting opening is filled up with the metal layer for filling up the source/drain openings 126S/126D and followed by the planarization process for forming the source/drain electrodes 140S/140D, and thus a gate contact plug 148 is formed in the gate contacting region 146 as shown in FIG. 7. Additionally, the metal filling step and the planarization process for forming the gate contact plug 148 can be different that for forming the source/drain electrodes 140S/140D, depending on different process requirement.

Please still refer to FIGS. 6 and 7. As mentioned above, the OS FET device 150 is obtained after forming the source electrode 140S and the drain electrode 140D. In accordance with the preferred embodiment, as shown in FIG. 6, the dielectric layer 120 is formed on the dielectric layer 112 and the back gate BG, and thus the back gate BG formed in the dielectric layer 112 is referred to as another gate electrode, which is isolated from the OS island 130 by the dielectric layer 120. Accordingly, the preferred embodiment provides a double gate type OS FET device 150. However, it will be easily realized by those skilled in the art that the OS FET device 150 can be a single gate type OS transistor device, depending on the product requirement. Furthermore, as shown in FIG. 6, a minimum spacing width d1 between the source electrode 140S and the drain electrode 140D is smaller than a sum d2 of a width of the gate electrode 140 and two times of a width of the etch stop layer 144.

After forming the OS FET device 150, steps for forming dielectric layers and metal layers (including wires and vias) of the BEOL interconnection structure 110 can be repeated any number of times to obtain a desired BEOL interconnection structure 110. Since those details are familiar to a person having ordinary skill in the art, therefore those details are all omitted in the interest of brevity.

According to the OS FET device and the method for manufacturing the same provided by the present invention, the gate electrode is formed on the OS island to define and cover the OS channel region. Therefore, the sensitive OS channel region is protected from any impact that might be generated in the subsequent steps. Furthermore, the etch stop layer is provided to protect the gate electrode and thus self-align source/drain process is performed without damaging the profile of the gate electrode. It should be noted that the OS FET device therefore can be further shrunk because of the involvement of self-align source/drain process. Accordingly, the present invention provides a simplified process for the method for manufacturing the OS FET device. More important, the reliability and stability of the obtained OS FET device are both improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. An oxide semiconductor field effect transistor (OS FET) device comprising:
   a first dielectric layer formed on a substrate;
   an oxide semiconductor (OS) island formed on the first dielectric layer;
   a first gate electrode formed on the OS island;
   a gate dielectric layer formed in between the first gate electrode and the OS island;
   a patterned hard mask layer formed on a top surface of the first gate electrode;
   an etch stop layer covering a top surface of the patterned hard mask layer and sidewalls of the first gate electrode, the etch stop layer directly contacting the sidewalls of the first gate electrode; and
   a source electrode and a drain electrode formed on the OS island, at least one of the source electrode and the drain electrode partially overlapping the etch stop layer on the sidewalls of the first gate electrode, wherein the source electrode and the drain electrode directly contact the portion of the etch stop layer directly contacting the sidewalls of the first gate electrode.

2. The OS FET device according to claim 1, further comprising a second dielectric layer and a second gate electrode formed in the second dielectric layer.

3. The OS FET device according to claim 2, wherein the first dielectric layer is formed on the second dielectric layer and the second gate electrode.

4. The OS FET device according to claim 3, wherein the second gate electrode and the OS island are isolated from each other by the first dielectric layer.

5. The OS FET device according to claim 1, further comprising a third dielectric layer formed on the first dielectric layer, and the source electrode and the drain electrode are formed in the third dielectric layer.

6. The OS FET device according to claim 1, wherein the gate dielectric layer covers sidewalls of the OS island and portions of a top surface of the OS island.

7. The OS FET device according to claim 6, wherein the etch stop layer covers the sidewalls of the OS island and the portions of the top surface of the OS island.

8. The OS FET device according to claim 1, wherein the first gate electrode comprises metal.

9. The OS FET device according to claim 1, wherein the etch stop layer comprises aluminum oxide (AlO), hafnium oxide (HfO), hafnium aluminum oxide (HfAlO), silicon nitride (SiN), zirconium oxide (ZrO) or a combination thereof.

10. The OS FET device according to claim 1, wherein a minimum spacing width between the source electrode and the drain electrode is smaller than a sum of a width of the first gate electrode and two times of a width of the etch stop layer.

11. A method for manufacturing an oxide semiconductor field effect transistor (OS FET) device, comprising:
   providing a first dielectric layer on a substrate;
   forming an OS island on the first dielectric layer;
   forming a gate dielectric layer on the OS island;
   forming a first gate electrode on the gate dielectric layer, the top surface of the first gate electrode being covered by a patterned hard mask layer;
   forming an etch stop layer on the first dielectric layer, the OS island and the first gate electrode, the top surface and sidewalls of the first gate electrode being covered by the etch stop layer, and the etch stop layer directly contacting the sidewalls of the first gate electrode; and
   forming a source electrode and a drain electrode on the OS island, the source electrode and the drain electrode respectively contacting the OS island, and the source electrode and the drain electrode partially overlapping the etch stop layer on the sidewalls of the first gate electrode, wherein the source electrode and the drain electrode directly contact the etch stop layer covering the sidewalls of the first gate electrode.

12. The method for manufacturing the OS FET device according to claim 11, further comprising a second dielectric layer and a second gate electrode formed in the second dielectric layer.

13. The method for manufacturing the OS FET device according to claim 12, wherein the first dielectric layer is formed on the second dielectric layer and the second gate electrode.

14. The method for manufacturing the OS FET device according to claim 13, wherein the second gate electrode and the OS island are isolated from each other by the first dielectric layer.

15. The method for manufacturing the OS FET device according to claim 11, further comprising forming a third dielectric layer on the etch stop layer after forming the etch stop layer.

16. The method for manufacturing the OS FET device according to claim 15, further comprising:
   forming a source opening and a drain opening in the third dielectric layer; and
   forming the source electrode and the drain electrode respectively in the source opening and the drain opening.

17. The method for manufacturing the OS FET device according to claim 16, further comprising a gate contacting region physically and electrically contacting the first gate electrode, and the patterned hard mask layer and the etch stop layer covering at least a top surface of the gate contacting region.

18. The method for manufacturing the OS FET device according to claim 17, further comprising removing the etch stop layer and the patterned hard mask layer from the top surface of the gate contacting region before or after forming the source openings and the drain opening.

19. The method for manufacturing the OS FET device according to claim 11, wherein the gate dielectric layer covers sidewalls of the OS island and portions of a top surface of the OS island, and the etch stop layer covers the sidewalls of the OS island and portions of the top surface of the OS island.

20. The method for manufacturing the OS FET device according to claim 11, wherein a minimum spacing width between the source electrode and the drain electrode is smaller than a sum of a width of the first gate electrode and two times of the width of the etch stop layer.

* * * * *